(12) United States Patent
Mishra et al.

(10) Patent No.: US 9,147,760 B2
(45) Date of Patent: *Sep. 29, 2015

(54) TRANSISTORS WITH ISOLATION REGIONS

(71) Applicant: Transphorm Inc., Goleta, CA (US)

(72) Inventors: Umesh Mishra, Montecito, CA (US); Srabanti Chowdhury, Goleta, CA (US)

(73) Assignee: Transphorm Inc., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/260,808

(22) Filed: Apr. 24, 2014

(65) Prior Publication Data

US 2014/0231929 A1    Aug. 21, 2014

Related U.S. Application Data

(63) Continuation of application No. 12/968,704, filed on Dec. 15, 2010, now Pat. No. 8,742,460.

(51) Int. Cl.
*H01L 29/778* (2006.01)
*H01L 29/06* (2006.01)
(Continued)

(52) U.S. Cl.
CPC .......... *H01L 29/778* (2013.01); *H01L 29/0649* (2013.01); *H01L 29/0657* (2013.01); *H01L 29/407* (2013.01); *H01L 29/4238* (2013.01); *H01L 29/7786* (2013.01); H01L 29/2003 (2013.01); H01L 29/207 (2013.01); H01L 29/402 (2013.01); H01L 29/41766 (2013.01); H01L 29/42376 (2013.01); H01L 2924/0002 (2013.01)

(58) Field of Classification Search
CPC .............. H01L 29/778; H01L 29/7786; H01L 29/4238
See application file for complete search history.

(56) References Cited

U.S. PATENT DOCUMENTS 4,300,091 A    11/1981    Schade, Jr.
4,532,439 A    7/1985    Koike
(Continued)

FOREIGN PATENT DOCUMENTS

CN    1748320    3/2006
CN    101002332    7/2007
(Continued)

OTHER PUBLICATIONS

Authorized officer Chung Keun Lee, International Search Report and Written Opinion in PCT/US2008/076030, mailed Mar. 23, 2009, 10 pages.
(Continued)

*Primary Examiner* — Joseph C Nicely
(74) *Attorney, Agent, or Firm* — Fish & Richardson P.C.

(57) ABSTRACT

A transistor device is described that includes a source, a gate, a drain, a semiconductor material which includes a gate region between the source and the drain, a plurality of channel access regions in the semiconductor material on either side of the gate, a channel in the semiconductor material having an effective width in the gate region and in the channel access regions, and an isolation region in the gate region. The isolation region serves to reduce the effective width of the channel in the gate region without substantially reducing the effective width of the channel in the access regions. Alternatively, the isolation region can be configured to collect holes that are generated in the transistor device. The isolation region may simultaneously achieve both of these functions.

11 Claims, 6 Drawing Sheets

(51) Int. Cl.
    *H01L 29/20*       (2006.01)
    *H01L 29/207*      (2006.01)
    *H01L 29/40*       (2006.01)
    *H01L 29/417*      (2006.01)
    *H01L 29/423*      (2006.01)

(56) References Cited

U.S. PATENT DOCUMENTS

| | | |
|---|---|---|
| 4,645,562 A | 2/1987 | Liao et al. |
| 4,728,826 A | 3/1988 | Einzinger et al. |
| 4,821,093 A | 4/1989 | Iafrate et al. |
| 4,914,489 A | 4/1990 | Awano |
| 5,051,618 A | 9/1991 | Lou |
| 5,329,147 A | 7/1994 | Vo et al. |
| 5,618,384 A | 4/1997 | Chan et al. |
| 5,646,069 A | 7/1997 | Jelloian et al. |
| 5,663,091 A | 9/1997 | Yen et al. |
| 5,705,847 A | 1/1998 | Kashiwa et al. |
| 5,714,393 A | 2/1998 | Wild et al. |
| 5,909,103 A | 6/1999 | Williams |
| 5,998,810 A | 12/1999 | Hatano et al. |
| 6,008,684 A | 12/1999 | Ker et al. |
| 6,097,046 A | 8/2000 | Plumton |
| 6,100,571 A | 8/2000 | Mizuta et al. |
| 6,292,500 B1 | 9/2001 | Kouchi et al. |
| 6,307,220 B1 | 10/2001 | Yamazaki |
| 6,316,793 B1 | 11/2001 | Sheppard et al. |
| 6,373,082 B1 | 4/2002 | Ohno et al. |
| 6,475,889 B1 | 11/2002 | Ring |
| 6,486,502 B1 | 11/2002 | Sheppard et al. |
| 6,504,235 B2 | 1/2003 | Schmitz et al. |
| 6,515,303 B2 | 2/2003 | Ring |
| 6,548,333 B2 | 4/2003 | Smith |
| 6,583,454 B2 | 6/2003 | Sheppard et al. |
| 6,586,781 B2 | 7/2003 | Wu et al. |
| 6,649,497 B2 | 11/2003 | Ring |
| 6,727,531 B1 | 4/2004 | Redwing et al. |
| 6,777,278 B2 | 8/2004 | Smith |
| 6,849,882 B2 | 2/2005 | Chavarkar et al. |
| 6,946,739 B2 | 9/2005 | Ring |
| 6,979,863 B2 | 12/2005 | Ryu |
| 6,982,204 B2 | 1/2006 | Saxler et al. |
| 7,030,428 B2 | 4/2006 | Saxler |
| 7,038,252 B2 | 5/2006 | Saito et al. |
| 7,045,404 B2 | 5/2006 | Sheppard et al. |
| 7,053,413 B2 | 5/2006 | D'Evelyn et al. |
| 7,071,498 B2 | 7/2006 | Johnson et al. |
| 7,084,475 B2 | 8/2006 | Shelton et al. |
| 7,109,552 B2 | 9/2006 | Wu |
| 7,125,786 B2 | 10/2006 | Ring et al. |
| 7,126,212 B2 | 10/2006 | Enquist et al. |
| 7,161,194 B2 | 1/2007 | Parikh et al. |
| 7,170,111 B2 | 1/2007 | Saxler |
| 7,230,284 B2 | 6/2007 | Parikh et al. |
| 7,238,560 B2 | 7/2007 | Sheppard et al. |
| 7,253,454 B2 | 8/2007 | Saxler |
| 7,265,399 B2 | 9/2007 | Sriram et al. |
| 7,268,375 B2 | 9/2007 | Shur et al. |
| 7,304,331 B2 | 12/2007 | Saito et al. |
| 7,321,132 B2 | 1/2008 | Robinson et al. |
| 7,326,971 B2 | 2/2008 | Harris et al. |
| 7,332,795 B2 | 2/2008 | Smith et al. |
| 7,364,988 B2 | 4/2008 | Harris et al. |
| 7,388,236 B2 | 6/2008 | Wu et al. |
| 7,419,892 B2 | 9/2008 | Sheppard et al. |
| 7,432,142 B2 | 10/2008 | Saxler et al. |
| 7,456,443 B2 | 11/2008 | Saxler et al. |
| 7,465,967 B2 | 12/2008 | Smith et al. |
| 7,488,992 B2 | 2/2009 | Robinson |
| 7,501,669 B2 | 3/2009 | Parikh et al. |
| 7,544,963 B2 | 6/2009 | Saxler |
| 7,547,925 B2 | 6/2009 | Wong et al. |
| 7,548,112 B2 | 6/2009 | Sheppard |
| 7,550,783 B2 | 6/2009 | Wu et al. |
| 7,550,784 B2 | 6/2009 | Saxler et al. |
| 7,566,580 B2 | 7/2009 | Keller et al. |
| 7,566,918 B2 | 7/2009 | Wu et al. |
| 7,573,078 B2 | 8/2009 | Wu et al. |
| 7,592,211 B2 | 9/2009 | Sheppard et al. |
| 7,598,108 B2 | 10/2009 | Li et al. |
| 7,605,017 B2 | 10/2009 | Hayashi et al. |
| 7,612,363 B2 | 11/2009 | Takeda et al. |
| 7,612,390 B2 | 11/2009 | Saxler et al. |
| 7,615,774 B2 | 11/2009 | Saxler |
| 7,638,818 B2 | 12/2009 | Wu et al. |
| 7,678,628 B2 | 3/2010 | Sheppard et al. |
| 7,692,263 B2 | 4/2010 | Wu et al. |
| 7,709,269 B2 | 5/2010 | Smith et al. |
| 7,709,859 B2 | 5/2010 | Smith et al. |
| 7,745,851 B2 | 6/2010 | Harris |
| 7,755,108 B2 | 7/2010 | Kuraguchi |
| 7,759,700 B2 | 7/2010 | Ueno et al. |
| 7,777,252 B2 | 8/2010 | Sugimoto et al. |
| 7,777,254 B2 | 8/2010 | Sato |
| 7,795,642 B2 | 9/2010 | Suh et al. |
| 7,812,369 B2 | 10/2010 | Chini et al. |
| 7,855,401 B2 | 12/2010 | Sheppard et al. |
| 7,859,020 B2 | 12/2010 | Kikkawa et al. |
| 7,859,021 B2 | 12/2010 | Kaneko |
| 7,875,537 B2 | 1/2011 | Suvorov et al. |
| 7,875,914 B2 | 1/2011 | Sheppard |
| 7,884,395 B2 | 2/2011 | Saito |
| 7,892,974 B2 | 2/2011 | Ring et al. |
| 7,893,424 B2 | 2/2011 | Eichler et al. |
| 7,893,500 B2 | 2/2011 | Wu et al. |
| 7,898,004 B2 | 3/2011 | Wu et al. |
| 7,901,994 B2 | 3/2011 | Saxler et al. |
| 7,906,799 B2 | 3/2011 | Sheppard et al. |
| 7,915,643 B2 | 3/2011 | Suh et al. |
| 7,915,644 B2 | 3/2011 | Wu et al. |
| 7,919,791 B2 | 4/2011 | Flynn et al. |
| 7,928,475 B2 | 4/2011 | Parikh et al. |
| 7,939,391 B2 | 5/2011 | Suh et al. |
| 7,948,011 B2 | 5/2011 | Rajan et al. |
| 7,955,918 B2 | 6/2011 | Wu et al. |
| 7,955,984 B2 | 6/2011 | Ohki |
| 7,960,756 B2 | 6/2011 | Sheppard et al. |
| 7,985,986 B2 | 7/2011 | Heikman et al. |
| 7,985,987 B2 | 7/2011 | Kaneko |
| 8,039,352 B2 | 10/2011 | Mishra et al. |
| 8,044,380 B2 | 10/2011 | Lee |
| 8,049,252 B2 | 11/2011 | Smith et al. |
| 8,093,606 B2 | 1/2012 | Sonobe et al. |
| 8,237,196 B2 | 8/2012 | Saito |
| 8,237,198 B2 | 8/2012 | Wu et al. |
| 8,390,000 B2 | 3/2013 | Chu et al. |
| 8,431,960 B2 | 4/2013 | Beach et al. |
| 8,471,267 B2 | 6/2013 | Hayashi et al. |
| 8,476,125 B2 | 7/2013 | Khan et al. |
| 8,519,438 B2 | 8/2013 | Mishra et al. |
| 8,525,231 B2 | 9/2013 | Park et al. |
| 8,598,937 B2 | 12/2013 | Lal et al. |
| 8,603,880 B2 | 12/2013 | Yamada |
| 8,716,141 B2 | 5/2014 | Dora et al. |
| 8,742,460 B2 * | 6/2014 | Mishra et al. ............... 257/194 |
| 2001/0032999 A1 | 10/2001 | Yoshida |
| 2001/0040247 A1 | 11/2001 | Ando et al. |
| 2002/0036287 A1 | 3/2002 | Yu et al. |
| 2002/0121648 A1 | 9/2002 | Hsu et al. |
| 2002/0167023 A1 | 11/2002 | Chavarkar et al. |
| 2003/0003724 A1 | 1/2003 | Uchiyama et al. |
| 2003/0006437 A1 | 1/2003 | Mizuta et al. |
| 2003/0020092 A1 | 1/2003 | Parikh et al. |
| 2003/0030056 A1 | 2/2003 | Callaway, Jr. |
| 2004/0041169 A1 | 3/2004 | Ren et al. |
| 2004/0061129 A1 | 4/2004 | Saxler et al. |
| 2004/0119067 A1 | 6/2004 | Weeks, Jr. et al. |
| 2004/0164347 A1 | 8/2004 | Zhao et al. |
| 2005/0001235 A1 | 1/2005 | Murata et al. |
| 2005/0077541 A1 | 4/2005 | Shen et al. |
| 2005/0133816 A1 | 6/2005 | Fan et al. |
| 2005/0189561 A1 | 9/2005 | Kinzer et al. |
| 2005/0189562 A1 | 9/2005 | Kinzer et al. |
| 2005/0194612 A1 | 9/2005 | Beach |

(56) References Cited

U.S. PATENT DOCUMENTS

| | | |
|---|---|---|
| 2005/0253168 A1 | 11/2005 | Wu et al. |
| 2005/0274977 A1 | 12/2005 | Saito et al. |
| 2006/0011915 A1 | 1/2006 | Saito et al. |
| 2006/0043499 A1 | 3/2006 | De Cremoux et al. |
| 2006/0060871 A1 | 3/2006 | Beach |
| 2006/0076677 A1 | 4/2006 | Daubenspeck et al. |
| 2006/0102929 A1 | 5/2006 | Okamoto et al. |
| 2006/0108602 A1 | 5/2006 | Tanimoto |
| 2006/0108605 A1 | 5/2006 | Yanagihara et al. |
| 2006/0121682 A1 | 6/2006 | Saxler |
| 2006/0124962 A1 | 6/2006 | Ueda et al. |
| 2006/0145189 A1 | 7/2006 | Beach |
| 2006/0157729 A1 | 7/2006 | Ueno et al. |
| 2006/0186422 A1 | 8/2006 | Gaska et al. |
| 2006/0189109 A1 | 8/2006 | Fitzgerald |
| 2006/0202272 A1 | 9/2006 | Wu et al. |
| 2006/0220063 A1 | 10/2006 | Kurachi et al. |
| 2006/0226442 A1 | 10/2006 | Zhang et al. |
| 2006/0255364 A1 | 11/2006 | Saxler et al. |
| 2006/0289901 A1 | 12/2006 | Sheppard et al. |
| 2007/0007547 A1 | 1/2007 | Beach |
| 2007/0018187 A1 | 1/2007 | Lee et al. |
| 2007/0018199 A1 | 1/2007 | Sheppard et al. |
| 2007/0018210 A1 | 1/2007 | Sheppard |
| 2007/0045670 A1 | 3/2007 | Kuraguchi |
| 2007/0080672 A1 | 4/2007 | Yang |
| 2007/0128743 A1 | 6/2007 | Huang et al. |
| 2007/0131968 A1 | 6/2007 | Morita et al. |
| 2007/0132037 A1 | 6/2007 | Hoshi et al. |
| 2007/0134834 A1 | 6/2007 | Lee et al. |
| 2007/0145390 A1 | 6/2007 | Kuraguchi |
| 2007/0145417 A1 | 6/2007 | Brar et al. |
| 2007/0158692 A1 | 7/2007 | Nakayama et al. |
| 2007/0164315 A1 | 7/2007 | Smith et al. |
| 2007/0164322 A1 | 7/2007 | Smith et al. |
| 2007/0194354 A1 | 8/2007 | Wu et al. |
| 2007/0205433 A1 | 9/2007 | Parikh et al. |
| 2007/0210329 A1 | 9/2007 | Goto |
| 2007/0215899 A1 | 9/2007 | Herman |
| 2007/0224710 A1 | 9/2007 | Palacios et al. |
| 2007/0228477 A1 | 10/2007 | Suzuki et al. |
| 2007/0241368 A1 | 10/2007 | Mil'shtein et al. |
| 2007/0249119 A1 | 10/2007 | Saito |
| 2007/0278518 A1 | 12/2007 | Chen et al. |
| 2007/0295985 A1 | 12/2007 | Weeks, Jr. et al. |
| 2008/0073670 A1 | 3/2008 | Yang et al. |
| 2008/0093626 A1 | 4/2008 | Kuraguchi |
| 2008/0121876 A1 | 5/2008 | Otsuka et al. |
| 2008/0157121 A1 | 7/2008 | Ohki |
| 2008/0203430 A1 | 8/2008 | Simin et al. |
| 2008/0230784 A1 | 9/2008 | Murphy |
| 2008/0237606 A1 | 10/2008 | Kikkawa et al. |
| 2008/0237640 A1 | 10/2008 | Mishra et al. |
| 2008/0272397 A1 | 11/2008 | Koudymov et al. |
| 2008/0274574 A1 | 11/2008 | Yun |
| 2008/0283844 A1 | 11/2008 | Hoshi et al. |
| 2008/0296618 A1 | 12/2008 | Suh et al. |
| 2008/0308813 A1 | 12/2008 | Suh et al. |
| 2009/0001409 A1 | 1/2009 | Takano et al. |
| 2009/0032820 A1 | 2/2009 | Chen |
| 2009/0032879 A1 | 2/2009 | Kuraguchi |
| 2009/0045438 A1 | 2/2009 | Inoue et al. |
| 2009/0050936 A1 | 2/2009 | Oka |
| 2009/0065810 A1 | 3/2009 | Honea et al. |
| 2009/0072240 A1 | 3/2009 | Suh et al. |
| 2009/0072269 A1 | 3/2009 | Suh et al. |
| 2009/0075455 A1 | 3/2009 | Mishra |
| 2009/0085065 A1 | 4/2009 | Mishra et al. |
| 2009/0121775 A1 | 5/2009 | Ueda et al. |
| 2009/0140262 A1 | 6/2009 | Ohki et al. |
| 2009/0146185 A1 | 6/2009 | Suh et al. |
| 2009/0201072 A1 | 8/2009 | Honea et al. |
| 2009/0218598 A1 | 9/2009 | Goto |
| 2009/0267078 A1 | 10/2009 | Mishra et al. |
| 2010/0019225 A1 | 1/2010 | Lee |
| 2010/0019279 A1 | 1/2010 | Chen et al. |
| 2010/0025730 A1 | 2/2010 | Heikman et al. |
| 2010/0065923 A1 | 3/2010 | Charles et al. |
| 2010/0067275 A1 | 3/2010 | Wang et al. |
| 2010/0133506 A1 | 6/2010 | Nakanishi et al. |
| 2010/0201439 A1 | 8/2010 | Wu et al. |
| 2010/0203234 A1 | 8/2010 | Anderson et al. |
| 2010/0219445 A1 | 9/2010 | Yokoyama et al. |
| 2010/0244087 A1 | 9/2010 | Horie et al. |
| 2010/0288998 A1 | 11/2010 | Kikuchi et al. |
| 2011/0006346 A1 | 1/2011 | Ando et al. |
| 2011/0012110 A1 | 1/2011 | Sazawa et al. |
| 2011/0249359 A1 | 10/2011 | Mochizuki et al. |
| 2012/0153390 A1 | 6/2012 | Mishra et al. |
| 2012/0168822 A1 | 7/2012 | Matsushita |
| 2012/0193638 A1 | 8/2012 | Keller et al. |
| 2012/0211800 A1 | 8/2012 | Boutros |
| 2012/0217512 A1 | 8/2012 | Renaud |
| 2012/0267637 A1 | 10/2012 | Jeon et al. |
| 2013/0056744 A1 | 3/2013 | Mishra et al. |
| 2013/0328061 A1 | 12/2013 | Chu et al. |
| 2014/0015066 A1* | 1/2014 | Wu et al. .................. 257/392 |
| 2014/0084346 A1 | 3/2014 | Tajiri |

FOREIGN PATENT DOCUMENTS

| | | |
|---|---|---|
| CN | 101107713 | 1/2008 |
| CN | 101312207 | 11/2008 |
| CN | 101897029 | 11/2010 |
| CN | 102017160 | 4/2011 |
| CN | 103477543 | 12/2013 |
| CN | 103493206 | 1/2014 |
| EP | 1 998 376 | 12/2008 |
| EP | 2 188 842 | 5/2010 |
| JP | 11-224950 | 8/1999 |
| JP | 2000-058871 | 2/2000 |
| JP | 3129264 | 11/2000 |
| JP | 2003-229566 | 8/2003 |
| JP | 2003-244943 | 8/2003 |
| JP | 2004-260114 | 9/2004 |
| JP | 2006-032749 | 2/2006 |
| JP | 2006-033723 | 2/2006 |
| JP | 2006-253559 | 9/2006 |
| JP | 2007-036218 | 2/2007 |
| JP | 2007-215331 | 8/2007 |
| JP | 2008-199771 | 8/2008 |
| JP | 2010-087076 | 4/2010 |
| JP | 2010-539712 | 12/2010 |
| KR | 2011-0033584 | 3/2011 |
| TW | 200924068 | 6/2009 |
| TW | 200924201 | 6/2009 |
| TW | 200947703 | 11/2009 |
| TW | 201010076 | 3/2010 |
| TW | 201027759 | 7/2010 |
| TW | 201027912 | 7/2010 |
| TW | 201036155 | 10/2010 |
| TW | 201322443 | 6/2013 |
| WO | WO 2004/070791 | 8/2004 |
| WO | WO 2004/098060 | 11/2004 |
| WO | WO 2005/036749 | 4/2005 |
| WO | WO 2005/070007 | 8/2005 |
| WO | WO 2005/070009 | 8/2005 |
| WO | WO 2006/114883 | 11/2006 |
| WO | WO 2007/077666 | 7/2007 |
| WO | WO 2007/108404 | 9/2007 |
| WO | WO 2008/120094 | 10/2008 |
| WO | WO 2009/036181 | 3/2009 |
| WO | WO 2009/036266 | 3/2009 |
| WO | WO 2009/039028 | 3/2009 |
| WO | WO 2009/039041 | 3/2009 |
| WO | WO 2009/076076 | 6/2009 |
| WO | WO 2009/132039 | 10/2009 |
| WO | WO 2010/039463 | 4/2010 |

(56) References Cited

FOREIGN PATENT DOCUMENTS

| WO | WO 2010/068554 | 6/2010 |
|---|---|---|
| WO | WO 2010/090885 | 8/2010 |
| WO | WO 2010/132587 | 11/2010 |
| WO | WO 2011/031431 | 3/2011 |
| WO | WO 2011/072027 | 6/2011 |

OTHER PUBLICATIONS

Authorized officer Yolaine Cussac, International Preliminary Report on Patentability in PCT/US2008/076030, Mar. 25, 2010, 5 pages.
Authorized officer Chung Keun Lee, International Search Report and Written Opinion in PCT/US2008/076079, mailed Mar. 20, 2009, 11 pages.
Authorized officer Nora Lindner, International Preliminary Report on Patentability in PCT/US2008/076079, mailed Apr. 1, 2010, 6 pages.
Authorized officer Keon Hyeong Kim, International Search Report and Written Opinion in PCT/US2008/076160 mailed Mar. 18, 2009, 11 pages.
Authorized officer Simin Baharlou, International Preliminary Report on Patentability in PCT/US2008/076160, mailed Mar. 25 2010, 6 pages.
Authorized officer Chung Keun Lee, International Search Report and Written Opinion in PCT/US2008/076199, mailed Mar. 24, 2009, 11 pages.
Authorized officer Dorothée Mülhausen, International Preliminary Report on Patentability in PCT/US2008/076199, mailed Apr. 1, 2010, 6 pages.
Authorized officer Keon Hyeong Kim, International Search Report and Written Opinion in PCT/US2008/085031, mailed Jun. 24, 2009, 11 pages.
Authorized officer Yolaine Cussac, International Preliminary Report on Patentability in PCT/US2008/085031, mailed Jun. 24, 2010, 6 pages.
Authorized officer Tae Hoon Kim, International Search Report and Written Opinion in PCT/US2009/041304, mailed Dec. 18, 2009, 13 pages.
Authorized officer Dorothée Mülhausen, International Preliminary Report on Patentability, in PCT/US2009/041304, mailed Nov. 4, 2010, 8 pages.
Authorized officer Sung Hee Kim, International Search Report and the Written Opinion in PCT/US2009/057554, mailed May 10, 2010, 13 pages.
Authorized Officer Gijsbertus Beijer, International Preliminary Report on Patentability in PCT/US2009/057554, mailed Mar. 29, 2011, 7 pages.
Authorized officer Cheon Whan Cho, International Search Report and Written Opinion in PCT/US2009/066647, mailed Jul. 1, 2010, 16 pages.
Authorized officer Athina Nikitas-Etienne, International Preliminary Report on Patentability in PCT/US2009/066647, mailed Jun. 23, 2011, 12 pages.
Authorized officer Sung Chan Chung, International Search Report and Written Opinion for PCT/US2010/021824, mailed Aug. 23, 2010, 9 pages.
Authorized officer Beate Giffo-Schmitt, International Preliminary Report on Patentability in PCT/US2010/021824, mailed Aug. 18, 2011, 6 pages.
Authorized officer Sang Ho Lee, International Search Report and Written Opinion in PCT/US2010/034579, mailed Dec. 24, 2010, 9 pages.
Authorized officer Nora Lindner, International Preliminary Report on Patentability in PCT/US2010/034579, mailed Nov. 24, 2011, 7 pages.
Authorized officer Jeongmin Choi, International Search Report and Written Opinion in PCT/US2010/046193, mailed Apr. 26, 2011, 13 pages.
Authorized officer Philippe Bécamel, International Preliminary Report on Patentability in PCT/US2010/046193, mailed Mar. 8, 2012, 10 pages.
Authorized officer Sang Ho Lee, International Search Report and Written Opinion in PCT/US2010/059486, mailed Jul. 26, 2011, 9 pages.
Authorized officer Nora Lindner, International Preliminary Report on Patentability in PCT/US2010/059486, mailed Jun. 21, 2012, 6 pages.
Authorized officer Kwan Sik Sul, International Search Report and Written Opinion in PCT/US2011/063975, mailed May 18, 2012, 8 pages.
Authorized officer Simin Baharlou, International Preliminary Report on Patentability in PCT/US2011/063975, mailed Jun. 27, 2013, 5 pages.
Authorized officer Sang-Taek Kim, International Search Report and Written Opinion in PCT/US2011/061407, mailed May 22, 2012, 10 pages.
Authorized officer Jeongmin Choi, International Search Report and Written Opinion in PCT/US2012/027146, mailed Sep. 24, 2012, 12 pages.
European Search Report in Application No. 10 81 5813.0, mailed Mar. 13, 2012, 9 pages.
Search Report and Action in TW Application No. 098132132, issued Dec. 6, 2012, 8 pages.
Chinese First Office Action for Application No. 200880120050.6, Aug. 2, 2011, 8 pages.
Chinese First Office Action for Application No. 200980114639.X, May 14, 2012, 13 pages.
Ando et al., "10-W/mm AlGaN—GaN HFET with a Field Modulating Plate," IEEE Electron Device Letters, 2003, 24(5):289-291.
Arulkumaran et al., "Enhancement of Breakdown Voltage by AlN Buffer Layer Thickness in AlGaN/GaN High-electron-mobility Transistors on 4 in. Diameter Silicon," Applied Physics Letters, 2005, 86:123503-1-3.
Arulkumaran et al. "Surface Passivation Effects on AlGaN/GaN High-Electron-Mobility Transistors with $SiO_2$, $Si_3N_4$, and Silicon Oxynitride," Applied Physics Letters, 2004, 84(4):613-615.
Barnett and Shinn, "Plastic and Elastic Properties of Compositionally Modulated Thin Films," Annu. Rev. Mater. Sci., 1994, 24:481-511.
Chen et al., "High-performance AlGaN/GaN Lateral Field-effect Rectifiers Compatible with High Electron Mobility Transistors," Applied Physics Letters, 2008, 92, 253501-1-3.
Cheng et al., "Flat GaN Epitaxial Layers Grown on Si(1 1 1) by Metalorganic Vapor Phase Epitaxy Using Step-graded AlGaN Intermediate Layers," Journal of Electronic Materials, 2006, 35(4):592-598.
Coffie, "Characterizing and Suppressing DC-to-RF Dispersion in AlGaN/GaN High Electron Mobility Transistors," 2003, PhD Thesis, University of California, Santa Barbara, 169 pages.
Coffie et al., "Unpassivated p-GaN/AlGaN/GaN HEMTs with 7.1 W/mm at 10 GhZ," Electronic Letters, 2003, 39(19):1419-1420.
Chu et al., "1200-V Normally Off GaN-on-Si Field-effect Transistors with Low Dynamic On-Resistance," IEEE Electron Device Letters, 2011, 32(5):632-634.
Dora et al., "High Breakdown Voltage Achieved on AlGaN/GaN HEMTs with Integrated Slant Field Plates," IEEE Electron Device Letters, 2006, 27(9):713-715.
Dora et al., "$ZrO_2$ Gate Dielectrics Produced by Ultraviolet Ozone Oxidation for GaN and AlGaN/GaN Transistors," J. Vac. Sci. Technol. B, 2006, 24(2)575-581.
Dora, "Understanding Material and Process Limits for High Breakdown Voltage AlGaN/GaN HEMTs," PhD Thesis, University of California, Santa Barbara, Mar. 2006, 157 pages.
Fanciulli et al., "Structural and Electrical Properties of $HfO_2$ Films Grown by Atomic Layer Deposition on Si, Ge, GaAs and GaN," Mat. Res. Soc. Symp. Proc., 2004, vol. 786, 6 pages.
Green et al., "The Effect of Surface Passivation on the Microwave Characteristics of Undoped AlGaN/GaN HEMT's," IEEE Electron Device Letters, 2000, 21(6):268 270.
Gu et al., "AlGaN/GaN MOS Transistors using Crystalline $ZrO_2$ as Gate Dielectric," Proceedings of SPIE, 2007, vol. 6473, 64730S-1-8.

(56) References Cited

OTHER PUBLICATIONS

Higashiwaki et al. "AlGaN/GaN Heterostructure Field-Effect Transistors on 4H-SiC Substrates with Current-Gain Cutoff Frequency of 190 GHz," Applied Physics Express, 2008, 021103-1-3.
Hwang et al., "Effects of a Molecular Beam Epitaxy Grown AlN Passivation Layer on AlGaN/GaN Heterojunction Field Effect Transistors," Solid-State Electronics, 2004, 48:363-366.
Im et al., "Normally Off GaN MOSFET Based on A1GaN/GaN Heterostructure with Extremely High 2DEG Density Grown on Silicon Substrate," IEEE Electron Device Letters, 2010, 31(3):192-194.
Karmalkar and Mishra, "Enhancement of Breakdown Voltage in AlGaN/GaN High Electron Mobility Transistors Using a Field Plate," IEEE Transactions on Electron Devices, 2001, 48(8):1515-1521.
Karmalkar and Mishra, "Very High Voltage AlGaN/GaN High Electron Mobility Transistors Using a Field Plate Deposited on a Stepped Insulator," Solid-State Electronics, 2001, 45:1645-1652.
Keller et al., "GaN—GaN Junctions with Ultrathin AlN Interlayers: Expanding Heterojunction Design." Applied Physics Letters, 2002, 80(23):4387-4389.
Keller et al., "Method for Heteroepitaxial Growth of High Quality N-Face GaN, InN and AlN and their Alloys by Metal Organic Chemical Vapor Deposition," U.S. Appl. No. 60/866,035, filed Nov. 15, 2006, 31 pages.
Khan et al., "AlGaN/GaN Metal Oxide Semiconductor Heterostructure Field Effect Transistor," IEEE Electron Device Letters, 2000, 21(2):63-65.
Kim, "Process Development and Device Characteristics of AlGaN/GaN HEMTs for High Frequency Applications," PhD Thesis, University of Illinois at Urbana-Champaign, 2007, 120 pages.
Kumar et al., "High Transconductance Enhancement-mode AlGaN/GaN HEMTs on SiC Substrate," Electronics Letters, 2003, 39(24):1758-1760.
Kuraguchi et al., "Normally-off GaN-MISFET with Well-controlled Threshold Voltage," Phys. Stats. Sol., 2007, 204(6):2010-2013.
Lanford et al., "Recessed-gate Enhancement-mode GaN HEMT with High Threshold Voltage, " Electronic Letters, 2005, 41(7):449-450.
Lee et al., "Self-aligned Process for Emitter- and Base-regrowth GaN HBTs and BJTs," Solid-State Electronics, 2001, 45:243-247.
Marchand et al., "Metalorganic Chemical Vapor Deposition on GaN on Si(1 1 1): Stress Control and Application to Filed-effect Transistors," Journal of Applied Physics, 2001, 89(12):7846-7851.
Mishra et al., "N-face High Electron Mobility Transistors with Low Buffer Leakage and Low Parasitic Resistance," U.S. Appl. No. 60/908,914, filed Mar. 29, 2007, 21 pages.
Mishra et al., "Polarization-induced Barriers for N-face Nitride-based Electronics," U.S. Appl. No. 60/940,052, filed May 24, 2007, 29 pages.
Mishra et al., "Growing N-polar III-nitride structures," U.S. Appl. No. 60/972,467, filed Sep. 14, 2007, 7 pages.
Mishra et al., "AlGaN/GaN HEMTs—An Overview of Device Operation and Applications," Proceedings of the IEEE, 2002, 90(6):1022-1031.
Nanjo et al., "Remarkable Breakdown Voltage Enhancement in AlGaN Channel High Electron Mobility Transistors," Applied Physics Letters 92 (2008), 3 pages.
Napierala et al., "Selective GaN Epitaxy on Si(1 1 1) Substrates Using Porous Aluminum Oxide Buffer Layers," Journal of the Electrochemical Society, 2006. 153(2):G125-G127, 4 pages.
Ota and Nozawa, "AlGaN/GaN Recessed MIS-gate HFET with High-threshold-voltage Normally-off Operation for Power Electronics Applications," IEEE Electron Device Letters, 2008, 29(7):668-670.
Palacios et al., "AlGaN/GaN HEMTs with an InGaN-based Back-barrier," Device Research Conference Digest, 2005, DRC '05 63rd, pp. 181-182.
Palacios et al., "AlGaN/GaN High Electron Mobility Transistors with InGaN Back-Barriers," IEEE Electron Device Letters, 2006, 27(1):13-15.

Palacios et al., "Fluorine Treatment to Shape the Electric Field in Electron Devices, Passivate Dislocations and Point Defects, and Enhance the Luminescence Efficiency of Optical Devices," U.S. Appl. No. 60/736,628, filed Nov. 15, 2005, 21 pages.
Palacios et al., "Nitride-based High Electron Mobility Transistors with a GaN Spacer," Applied Physics Letters, 2006, 89:073508-1-3.
Pei et al., "Effect of Dielectric Thickness on Power Performance of AlGaN/GaN HEMTs," IEEE Electron Device Letters, 2009, 30(4):313-315.
"Planar, Low Switching Loss, Gallium Nitride Devices for Power Conversion Applications," SBIR N121-090 (Navy), 3 pages.
Rajan et al., "Advanced Transistor Structures Based on N-face GaN," 32M International Symposium on Compound Semiconductors (ISCS), Sep. 18-22, 2005, Europa-Park Rust, Germany, 2 pages.
Reiher et al., "Efficient Stress Relief in GaN Heteroepitaxy on Si(1 1 1) Using Low-temperature Aln Interlayers," Journal of Crystal Growth, 2003, 248:563-567.
Saito et al., "Recessed-gate Structure Approach Toward Normally Off High-voltage AlGaN/GaN HEMT for Power Electronics Applications," IEEE Transactions on Electron Device, 2006, 53(2):356-362.
Shelton et al., "Selective Area Growth and Characterization of AlGaN/GaN Heterojunction Bipolar Transistors by Metalorganic Chemical Vapor Deposition," IEEE Transactions on Electron Devices, 2001, 48(3):490-494.
Shen, "Advanced Polarization-based Design of AlGaN/GaN HEMTs," Jun. 2004, PhD Thesis, University of California, Santa Barbara, 192 pages.
Sugiura et al., "Enhancement-mode $n$-channel GaN MOSFETs Fabricated on $p$-GaN Using $HfO_2$ as Gate Oxide," Electronics Letters, 2007, vol. 43, No. 17, 2 pages.
Suh et al., "High Breakdown Enhancement Mode GaN-based HEMTs with Integrated Slant Field Plate," U.S. Appl. No. 60/822,886, filed Aug. 18, 2006, 16 pages.
Suh et al. "High-Breakdown Enhancement-mode AlGaN/GaN HEMTs with Integrated Slant Field-Plate," Electron Devices Meeting, 2006, IEDM '06 International, 3 pages.
Suh et al., "III-Nitride Devices with Recessed Gates," U.S. Appl. No. 60/972,481, filed Sep. 14, 2007, 18 pages.
Tipirneni et al. "Silicon Dioxide-encapsulated High-Voltage AlGaN/GaN HFETs for Power-Switching Applications, " IEEE Electron Device Letters, 2007, 28(9):784-786.
Vetury et al., "Direct Measurement of Gate Depletion in High Breakdown (405V) Al/GaN/GaN Heterostructure Field Effect Transistors," IEDM 98, 1998, pp. 55-58.
Wang et al., "Comparison of the Effect of Gate Dielectric Layer on 2DEG Carrier Concentration in Strained AlGaN/GaN Heterostructure," Mater. Res. Soc. Symp. Proc., 2007, vol. 831, 6 pages.
Wang et al., "Enhancement-mode $Si_3N_4$/AlGaN/GaN MISHFETs," IEEE Electron Device Letters, 2006, 27(10):793-795.
Wu, "AlGaN/GaN Microwave Power High-Mobility Transistors," PhD Thesis, University of California, Santa Barbara, Jul. 1997, 134 pages.
Wu et al., "A 97.8% Efficient GaN HEMT Boost Converter with 300-W Output Power at 1MHz,"Electronic Device Letters, 2008, IEEE, 29(8):824-826.
Yoshida, "AlGan/GaN Power FET," Furukawa Review, 2002, 21:7-11.
Zhang, "High Voltage GaN HEMTs with Low On-resistance for Switching Applications," PhD Thesis, University of California, Santa Barbara, Sep. 2002, 166 pages.
Zhanghong Content, Shanghai Institute of Metallurgy, Chinese Academy of Sciences, "Two-Dimensional Electron Gas and High Electron Mobility Transistor (HEMT)," Dec. 31, 1984, 17 pages.
Authorized officer Lingfei Bai, International Preliminary Report on Patentability in PCT/US2011/061407, mailed Jun. 6, 2013, 7 pages.
Authorized officer Athina Nickitas-Etienne, International Preliminary Report on Patentability in PCT/US2012/027146, mailed Sep. 19, 2013, 9 pages.
Authorized officer Kwan Sik Sul, International Search Report and Written Opinion in PCT/US2012/023160, mailed May 24, 2012, 9 pages.

(56) References Cited

OTHER PUBLICATIONS

Authorized officer Simin Baharlou, International Preliminary Report on Patentability in PCT/US2012/023160, mailed Aug. 15, 2013, 6 pages.
Authorized officer Tae Hoon Kim, International Search Report and Written Opinion in PCT/US2013/035837, mailed Jul. 30, 2013, 9 pages.
Authorized officer Agnés Wittmann-Regis, International Preliminary Report on Patentability in PCT/US2013/035837, mailed Oct. 23, 2014, 6 pages.
Authorized officer Sang Won Choi, International Search Report and Written Opinion in PCT/US2013/048275, mailed Oct. 14, 2013, 17 pages.
Authorized officer Hye Lyun Park, International Search Report and Written Opinion in PCT/US2013/050914, mailed Oct. 18, 2013, 11 pages.
Authorized officer Sang Won Choi, International Search Report and Written Opinion in PCT/US2013/024470, mailed May 27, 2013, 12 pages.
Authorized officer Simin Baharlou, International Preliminary Report on Patentability in PCT/US2013/024470, mailed Aug. 14, 2014, 9 pages.
Authorized officer June Young Son, International Search Report and Written Opinion in PCT/US2014/016298, mailed May 23, 2014, 15 pages.
Authorized officer Tae Hoon Kim, International Search Report and Written Opinion in PCT/US2014/027523, mailed Jul. 30, 2014, 14 pages.
Authorized officer June Young Son, International Search Report and Written Opinion in PCT/US2014/024191, mailed Aug. 7, 2014, 11 pages.
Authorized officer June Young Son, International Search Report and Written Opinion in PCT/US2014/046030, mailed Oct. 21, 2014, 12 pages.
Search Report and Action in TW Application No. 098141930, issued Jul. 10, 2014, 7 pages.
First Office Action in CN Application No. 201180059979.4, issued Jul. 27, 2015, 20 pages.

* cited by examiner

TRANSISTORS WITH ISOLATION REGIONS

CROSS-REFERENCE TO RELATED APPLICATION

This application is a continuation application of U.S. patent application Ser. No. 12/968,704, filed Dec. 15, 2010, the disclosure of which is hereby incorporated by reference in its entirety.

TECHNICAL FIELD

Semiconductor electronic devices and components, and a variety of circuit applications in which the devices and components may be utilized are described.

BACKGROUND

To date, most transistors used in power electronic applications have typically been fabricated with silicon (Si) semiconductor materials. Common transistor devices for power applications include Si CoolMOS, Si Power MOSFETs, and Si Insulated Gate Bipolar Transistors (IGBTs). While Si power devices are inexpensive, they suffer from a number of disadvantages, including relatively low switching speeds and high levels of electrical noise. More recently, silicon carbide (SiC) power devices have been considered due to their superior properties. III-N semiconductor devices, such as gallium nitride (GaN) devices, are now emerging as attractive candidates to carry large currents, support high voltages and to provide very low on-resistance and fast switching times. While numerous III-N transistors and diodes have been demonstrated, improvements in reliability are still necessary in order to enable large scale manufacturing and more widespread adoption of these devices.

FIG. 1 shows a transistor of the prior art having source electrode 14, drain electrode 15, gate electrode 13 and access regions 23 and 24. As used herein, the "access regions" of a transistor refer to the two regions between the source and gate electrodes, and between the gate and drain electrodes of the transistor, i.e., regions 23 and 24, respectively, in FIG. 1. Region 23, the access region on the source side of the gate, is typically referred to as the source access region, and region 24, the access region on the drain side of the gate, is typically referred to as the drain access region. As used herein, the "gate region" 31 of a transistor refers to the portion of the transistor between the two access regions 23 and 24 in FIG. 1.

In typical power switching applications in which switching transistors are used, the transistor is at all times in one of two states. In the first state, which is commonly referred to as the "on state", the voltage at the gate electrode relative to the source electrode is higher than the transistor threshold voltage, and substantial current flows through the transistor. In this state, the voltage difference between the source and drain is typically low, usually no more than a few volts, such as about 0.1-5 volts. In the second state, which is commonly referred to as the "off state", the voltage at the gate electrode relative to the source electrode is lower than the transistor threshold voltage, and no substantial current flows through the transistor. Whether the device is on or off depends on whether or not current is able to flow through the device (off=no current). Current flow is determined by the voltage on the gate. When the device is on (gate voltage is high), only a small voltage (0.1-5V) at the drain is required to keep the current flowing. Whereas, when the device is off (gate voltage is low), no substantial current flows regardless of how much voltage is applied to the drain (up to the high voltage limit of the device, at which point the device breaks down).

In the off state, the voltage between the source and drain can range anywhere from about 0V to the value of the circuit high voltage supply, which in some cases can be as high as 100V, 300V, 600V, 1200V, 1700V, or higher. When the transistor is in the off state, it is said to be "blocking a voltage" between the source and drain. As used herein, the term "blocking a voltage" refers to the ability of a transistor to prevent substantial current, such as a current that is greater than 0.001 times the operating current during regular conduction, from flowing through the transistor when a voltage is applied across the transistor. In other words, while a transistor is blocking a voltage applied across it, the total current passing through the transistor will not be greater than 0.001 times the operating current during regular conduction.

As used herein, a "high-voltage device", such as a high-voltage transistor, is an electronic device which is optimized for high-voltage switching applications. That is, when the transistor is off, it is capable of blocking high voltages, such as about 300V or higher, about 600V or higher, about 1200V or higher, or about 1700V or higher, and when the transistor is on, it has a sufficiently low on-resistance ($R_{ON}$) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300V, 600V, 1200V, 1700V, or other suitable blocking voltage required by the application. In other words, a high-voltage device can block any voltage between 0V and at least $V_{max}$, where $V_{max}$ is the maximum voltage that could be supplied by the circuit or power supply. In some implementations, a high-voltage device can block any voltage between 0V and at least $2*V_{max}$.

SUMMARY

In one aspect, a transistor device having a short-circuit survival time is described. The transistor device includes a source, a gate, a drain, and a semiconductor material which includes a gate region, the gate region being between the source and the drain. The transistor device further includes a plurality of channel access regions in the semiconductor material between the source and the gate and between the drain and the gate, respectively, a channel in the semiconductor material having an effective width in the gate region and in the channel access regions, and an isolation region in the gate region serving to reduce the effective width of the channel in the gate region without substantially reducing the effective width of the channel in the access regions.

In another aspect, a transistor device is described that includes a source, a gate, a drain, and a semiconductor material which includes a gate region, the gate region being between the source and the drain. The transistor device further includes a plurality of channel access regions in the semiconductor material between the source and the gate and between the drain and the gate, respectively, a channel in the semiconductor material, and an isolation region in or near a region of the semiconductor material which has a high electric field or is at a low electric potential during device operation, serving to improve the efficiency of hole collection from the semiconductor material.

In yet another aspect, a transistor device is described that includes a source having a source width, the transistor device having a maximum current and an on-resistance. The maximum current per unit source width of the transistor device is less than 500 milliamps/millimeter, and the on-resistance multiplied by the source width is less than 30 ohm-millimeters.

For all devices described herein, one or more of the following may be applicable. The device can include a plurality of isolation regions in the gate region. An isolation region can be a region etched through the channel. The device can include a field plate, which can be along an edge of the isolation region or can lie over the channel access region between the gate and the drain. The field plate can be a slant field plate. The field plate can be connected to one of the gate, the source, the drain, ground or a DC voltage. The isolation region can lie beneath or near to the field plate. The isolation region can contain dopants implanted into the semiconductor material to a depth greater than the depth of the channel, and the dopants can be selected from the group consisting of Mg, Al and Fe. The device can be a III-N transistor. The device can be a field effect transistor. The isolation region can be capable of collecting holes generated in the semiconductor material. The gate or the source can contact a surface of the isolation region. The isolation region can increase the short-circuit survival time of the transistor. The device can be a high-voltage device. The isolation region can lie beneath or near the source. The isolation region can lie beneath or near the gate. The isolation region can lie between the source and the gate. The device may further include a metal electrode contacting a surface of the isolation region. The device can be capable of blocking at least 600V. The on-resistance multiplied by the source width can be less than 15 ohm-millimeters. The maximum current can be less than 50 A. The on-resistance can be less than 1 ohm. The product of the maximum current and the on-resistance can be less than about 5 Amp-ohms.

Isolation regions can be used in transistor devices to limit the maximum current that can flow through the device without substantially increasing the on-resistance of the device. Alternatively, isolation structures or regions can be configured to collect holes that are generated in the transistor device. The isolation regions may simultaneously achieve both of these functions.

DESCRIPTION OF DRAWINGS

Like reference symbols in the various drawings indicate like elements.

DESCRIPTION OF AN EMBODIMENT

Figure 1:
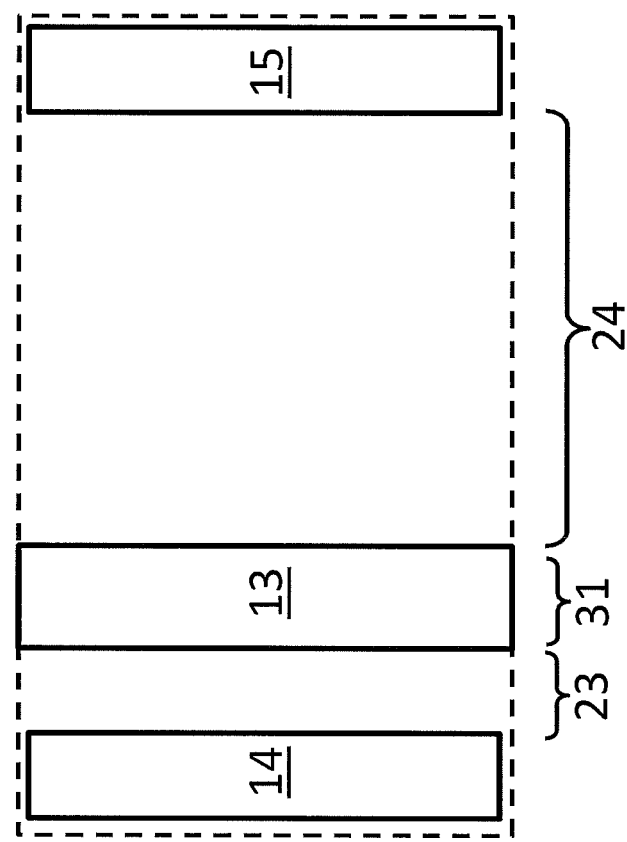
FIG. 1 is a plan view of a prior art device.

Referring to FIGS. 2-5, a transistor device is described that has a lower channel charge density and/or lower channel conductivity in the gate region of the device than in the device access regions, and thus has a reduced short-circuit current $I_{max}$ while still maintaining a low on-resistance. Transistor 1 includes isolation regions 20, 21 and 22 between the source 14 and the drain 15. The isolation regions can be configured to increase or maximize the short-circuit survival time of the transistor 1 by reducing or minimizing the maximum channel current (short-circuit current) $I_{max}$ that can flow through the device, while maintaining an acceptably low on-resistance. Alternatively, the isolation structures or regions can be configured to collect holes that are generated in the transistor 1. The isolation regions may simultaneously achieve both of these functions. The transistors can be lateral devices, III-N devices, field effect transistors, enhancement-mode devices (threshold voltage >0V), depletion-mode devices (threshold voltage <0V), high-voltage devices, or any combination of these devices. III-N devices can be III-polar (III-face) devices, N-polar (N-face) devices or semipolar devices. A Ga-face, III-face or III-polar III-N device can include III-N materials grown with a group III-face or [0 0 0 1] face furthest from the growth substrate, or can include source, gate, or drain electrodes on a group III-face or [0 0 0 1] face of the III-N materials. A nitrogen-face, N-face, or N-polar III-N device can include III-N materials grown with an N-face or [0 0 0 1 bar] face furthest from the growth substrate, or can include source, gate, or drain electrodes on an N-face or [0 0 0 1 bar] face of the III-N materials.

When a semiconductor device such as a transistor is operated in the off state, large electric fields may be present in the material layers, especially when the device is used in high-voltage applications. These large electric fields can result in the creation of holes, such as by impact ionization, in regions in which these electric fields are large. The holes, which have a positive electrical charge, migrate within the device structure towards regions of low electric potential (i.e., low voltage). The presence of these positively charged holes can lead to shifts in the device threshold voltage, reduced reliability, and other undesirable effects. Hence, it is desirable to minimize or eliminate the effects of these holes.

Furthermore, in some circuit or system applications in which high-voltage transistors are used, during failure of the circuit or system, the transistor can be operated in the on state (i.e. conducting current) with a large voltage between the source and drain, for short periods of time. During this short time, the current flowing through the transistor is the maximum current that the transistor is capable of conducting. This maximum current value is typically referred to as the "short-circuit current" and is represented by the symbol $I_{max}$. For example, in a motor drive circuit, there are times in which the motor can stop turning, accompanied by a simultaneous large current (i.e., short-circuit current) through the high-voltage transistors in the motor drive circuit, and a large voltage across the source and drain terminals of these transistors. The control circuitry, which can send a voltage signal to the gate of the transistors to turn the devices off and thereby prevent further current from flowing, has a finite response time, typically about 10 microseconds. Hence this high current, high voltage mode of operation is sustained for this entire response time of the control circuitry.

During the high current, high voltage mode of operation described above, the high-voltage transistors and/or other circuit components can become damaged or rendered inoperable. The length of time for which the high current, high voltage mode of operation can be sustained without damaging the transistor, known as the "short-circuit survival time," is represented by the symbol τ and given by the equation $\tau=[\Delta T*m*C]/[I_{max}*V]$, where $\Delta T$ is the maximum temperature rise of the transistor before damage is incurred, m is the thermal mass of the transistor (i.e., the mass of material in the vicinity of the transistor channel, such as the mass of material within about 5 microns of the transistor channel), C is the average thermal capacity of the material in the vicinity of the transistor channel, $I_{max}$ is the maximum current that the transistor is capable of conducting (i.e., the short-circuit current), and V is the average voltage across the transistor during the high current, high voltage mode of operation.

As seen from the equation for τ above, one way to increase τ is to decrease the short-circuit current $I_{max}$ without substantially affecting any of the other parameters in the equation for τ. For example, this can be accomplished by designing the transistor with a lower channel charge density and/or lower channel conductivity. However, reducing $I_{max}$ by this method, as well as by many other methods, increases the transistor's on-resistance $R_{on}$, hence increasing the power loss during normal operation. It is therefore desirable to reduce $I_{max}$ without substantially affecting any of these other parameters in the equation for τ, while only minimally increasing the on-resistance.

Most conventional III-N high electron mobility transistors (HEMTs) and related transistor devices are normally on, i.e., have a negative threshold voltage, which means that they can conduct current at zero gate voltage. These devices with negative threshold voltages are known as depletion-mode (D-mode) devices. It can be preferable in some power electronics applications to have normally-off devices, i.e., devices with positive threshold voltages, that cannot conduct current at zero gate voltage, in order to avoid damage to the device or to other circuit components by preventing accidental turn-on of the device. Normally-off devices are commonly referred to as enhancement-mode (E-mode) devices.

Referring to FIGS. 2-5, as used herein, the "gate region" of a transistor refers to the portion 31 of the transistor between the two access regions 23 and 24. The transistor of FIGS. 2-5 includes isolation regions 20, 21, and 22 (shown in the plan view of FIG. 2) at least partially within the gate region 31 of the device.

Isolation regions 20-22 are regions through which substantial channel current cannot flow, i.e., they provide a break in the device channel between source 14 and drain 15. They can be etched regions where semiconductor material has been etched through the channel, or ion-implanted regions implanted with Al, Mg or Fe ions, for example. As shown in the cross-sectional views of FIGS. 3, 4, and 5, the device includes a substrate 10, a semiconductor material structure 32, a conductive channel 19, such as a two-dimensional electron gas (2DEG) in the semiconductor material structure 32, an insulating material layer 33, which can include a gate insulator portion 17 beneath the gate of the device, source 14, drain 15, gate contacts 16, 18, 25, and 26 (shown in the plan view of FIG. 2), and field plates 27, 28, 29, and 30 (shown in the plan view of FIG. 2).

Figure 3:
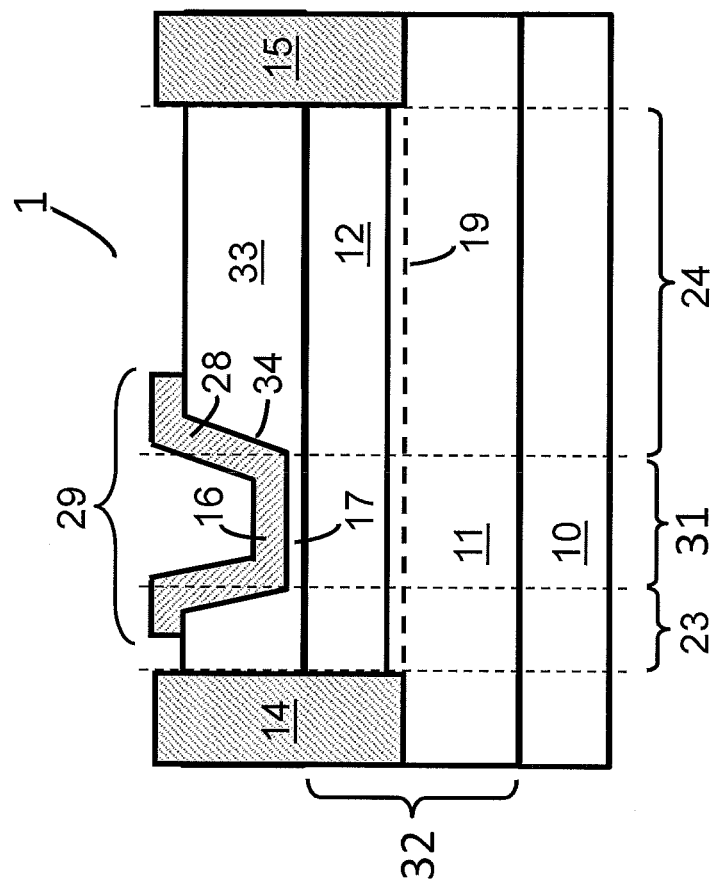
FIG. 3 is a cross-section through the cut 3-3 of the device of FIG. 2.
Figure 4:
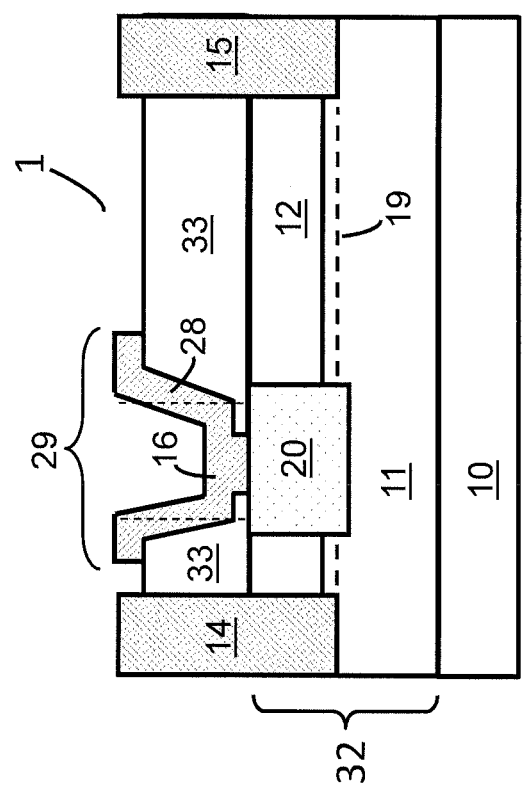
FIG. 4 is a cross-section through the cut 4-4 of the device of FIG. 2.
Figure 5:
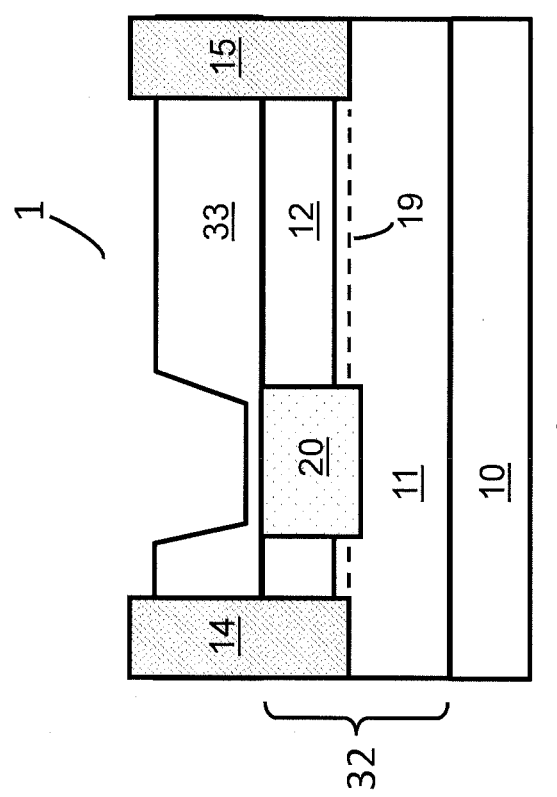
FIG. 5 is a cross-section through the cut 5-5 of the device of FIG. 2.

As seen in FIG. 3, the portion of electrode 29 which is in the gate region 31 is the gate contact 16, and the portion of electrode 29 which is in the drain access region 24 is the field plate 28. The gate contacts 16, 18, 25, and 26 can all be electrically connected to one another, for example externally in the circuit or outside the periphery of the intrinsic device (not shown). The semiconductor material structure 32 can include multiple semiconductor layers, such as channel layer 11 and barrier layer 12, as shown in FIGS. 3-5. In some implementations, the semiconductor material structure includes or is formed of III-N materials, and the device is a III-N device, such as a III-N transistor or FET. For example, channel layer 11 can be GaN and barrier layer 12 can be $Al_xGa_{1-x}N$. As used herein, the terms III-Nitride or III-N materials, layers, devices, structures, etc., refer to a material, device, or structure comprised of a compound semiconductor material according to the stoichiometric formula $Al_xIn_yGa_zN$, where x+y+z is about 1. In a III-Nitride or III-N device, the conductive channel can be partially or entirely contained within a III-N material layer.

The slant field plates 27-30 shown in FIGS. 2-5 are formed of the same conducting material as the gate contacts 16, 18, 25 and 26. Examples of such conducting materials are Ni, Pt, poly-silicon, Al, Ti, Au, or combinations thereof. Field plates can be used in semiconductor devices, such as transistors, to shape the electric field in the high-field region of the device in such a way that reduces the peak electric field and increases the device breakdown voltage, thereby allowing for higher voltage operation. A field plate does not necessarily need to be formed of the same material as the gate, and it does not necessarily need to be connected to the gate; in some cases, it can be connected to the source, the drain, an electrical ground or a DC voltage source. Insulating material layer 33 (shown in FIGS. 3-5) at least partially defines the geometry of the gate and field plate structures. In the implementation shown in FIG. 3, for example, the insulating material layer 33 includes a slanted edge 34 on the drain side of the gate, and the field plate 28 is on top of, and contacting slanted edge 34. Hence the field plate 28 is a "slant field plate", as shown in FIG. 3. The slanted edge 34 includes at least a substantial portion which is at a non-perpendicular angle to a main surface of the semiconductor material structure 32. Alternative field plate structures to a slant field plate may also be used.

Still referring to FIGS. 2-5, the isolation regions 20, 21, and 22 effectively reduce the width of the channel in the gate region 31 without substantially reducing the effective width of the channel in the access regions 23 and 24. For example, the device includes three isolation regions 20, 21 and 22, each of width $W_{iso}$ (see FIG. 2), such that the total width of all the isolation regions, $W_{tot}$, equals $3*W_{iso}$. The isolation regions 20, 21 and 22 reduce the channel width in the gate region 31 between source 14 and drain 15 from a value of $W_{source}$ (the entire extent of the source contact) to a value of ($W_{source}-W_{tot}$). The maximum current $I_{max}$, which is proportional to the channel width in the gate region, is thereby reduced by a factor ($W_{source}-W_{tot}$)/$W_{source}$, while the access resistances (i.e., the channel resistances in the access regions) stay approximately the same. Hence, the total device on-resistance, which is equal to the sum of the intrinsic channel on-resistances (i.e., the on-resistance of the portion of the channel in the gate region 31) and the access resistances, may not increase substantially.

In some implementations, isolation regions 20, 21 and 22 are used to limit $I_{max}$. They can be formed by implanting ions into the semiconductor material structure 32. For III-N devices, ions that may be implanted may include, but are not limited to, Al, Mg, or Fe. Or, the isolation regions can be formed by etching the semiconductor material at least to a depth greater than the depth of the device channel, thereby physically removing a portion of the device channel. The isolation regions can extend at least all the way from the side of the gate region 31 nearest the source 14, to the other side of the gate region 31 nearest the drain 15, as this may be necessary to ensure that current is reduced by a factor ($W_{source}-W_{tot}$)/$W_{source}$, compared to an otherwise identical device which does not include isolation regions.

Figure 2:
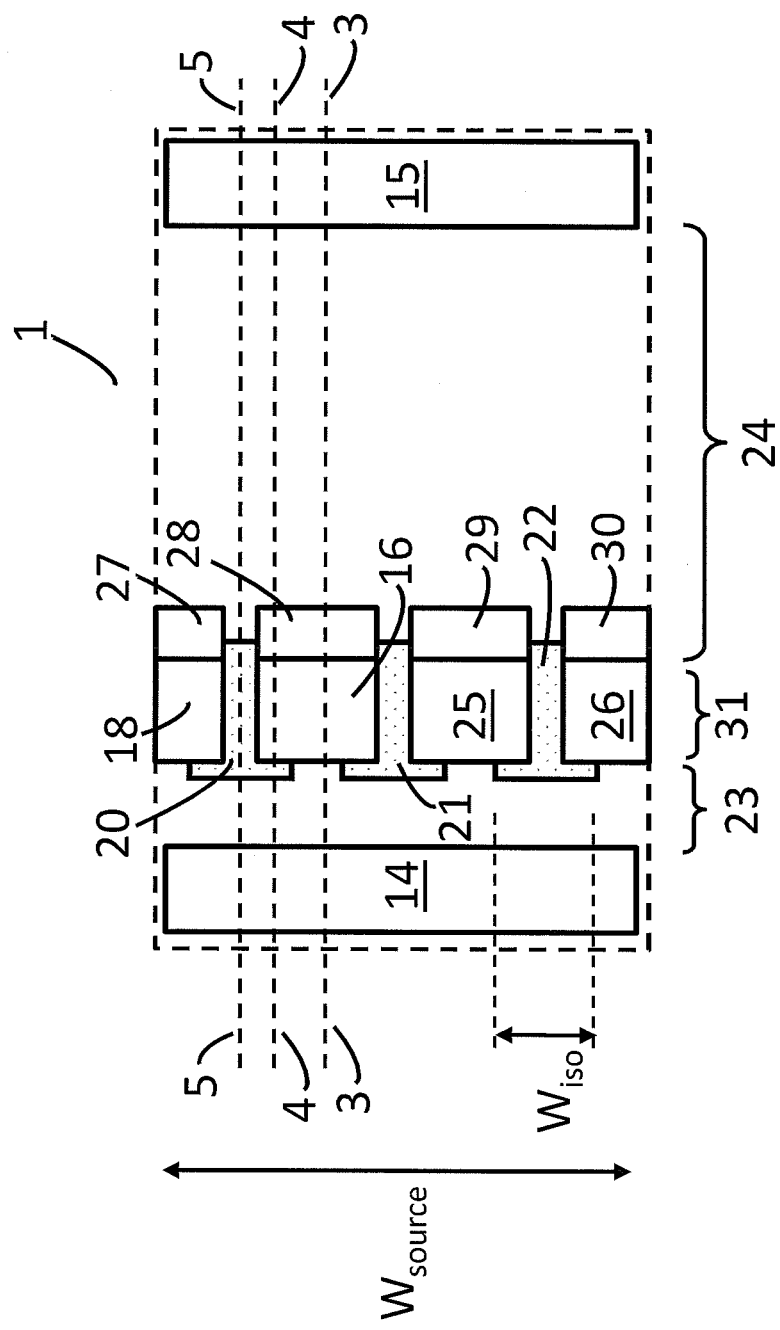
FIG. 2 is a plan view of a device according to this specification.

For devices with a field plate or multiple field plates 27, 28, 29 and 30 connected to the drain-side edge of the gate, as shown in FIG. 2, the isolation regions may optionally further extend towards the drain beyond the drain-side edge of the field plates shown in FIG. 2. $W_{tot}$ can be between about 1% and 99% of $W_{source}$, such as between about 10% and 90%, between about 20% and 80%, or between about 10% and 20% of $W_{source}$. Although the gate does not need to be directly over the isolation regions 20, 21 and 22, it may cover part or all of the portions of the isolation regions 20, 21 and 22 that are in the gate region of the device. This can be advantageous as it may simplify the device fabrication process. The gate metal can be in electrical contact with the isolation regions, or can be electrically isolated from them. When the isolation regions are etched regions, the electric fields along their edges may be increased or enhanced during device operation. Hence, in order to prevent a reduction in the transistor breakdown voltage, it may be necessary to include field plates along some or all of the edges of the etched isolation regions 20, 21 and 22. For example, the same or a similar field plate structure to the one used along the drain-side edge of the gate also can be used along some or all of the edges of etched isolation regions.

Figure 6:
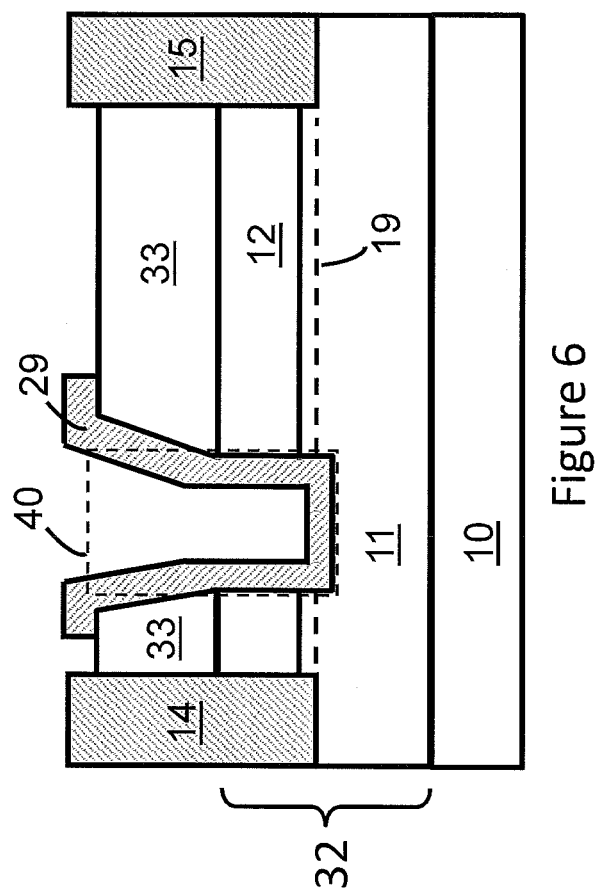
FIG. 6 is a cross-sectional view of a device according to this specification.

FIG. 6 illustrates a device with an isolation region 40, where the isolation region is formed by etching the semiconductor material at least to a depth greater than the depth of the device channel, thereby physically removing a portion of the device channel. The cross-section shown in FIG. 6 is similar to that in FIG. 4, except that in FIG. 6 the electrode 29 which includes the gate is deposited conformally along the portions of III-N layers 12 and 11 that were exposed by the etch. Alternatively, an insulator can be placed between the electrode 29 and III-N layers 11 and 12 (not shown). When an insulator is included between the electrode 29 and III-N layers 11 and 12, an aperture may be etched through the insulator such that the electrode 29 directly contacts one or both of III-N layers 11 and 12 in the aperture region.

Isolation regions 20, 21 and 22 may also be used to collect holes that are formed in the device material layers 32 during times when the electric fields in the device are sufficiently high, such as when the device is in the off-state and is blocking a high voltage. Isolation regions used as hole collectors can cause the holes to be transported away from the vicinity of the device channel, thereby mitigating their deleterious effects on device performance and reliability. The isolation regions can be placed in a region of low electric potential (voltage), such that holes are drawn towards the isolation regions. Once the holes approach or are incident upon the isolation regions, they can be drawn away from the vicinity of the channel or other active regions of the device. For example, in some implementations, the holes can recombine with electrons near to or within the isolation regions 20, 21 and 22. In other implementations, a metal electrode (not shown) is connected to the surface of an isolation region, and a sufficiently low or negative voltage is applied to that electrode to carry the holes away through the electrode as an electrical current. In other implementations, the gate metal is in electrical contact with the surface of the isolation region. Since the gate 16 is typically at a low or negative voltage when the transistor 1 is in the off state, the voltage on the gate may be sufficient to draw the holes away from the vicinity of the device channel or other active regions.

For isolation regions to function as hole collectors, in many cases it can be necessary for the gate metal 16 to electrically contact at least a portion of the underlying semiconductor material in the isolation regions 20, 21 and 22. Many transistors include gate dielectrics 17, which are insulators between the gate metal 16 and the underlying semiconductor material 12. When gate dielectrics are used, a break in the dielectric may be required over at least a portion of isolation region 20, 21 and 22 in order to allow the gate metal 16 or other electrode to contact the underlying isolation region.

Isolation regions 20, 21 and 22 used as hole collectors can have the following properties. They can be regions in which the semiconductor material is etched, in some cases at least through the device channel. In this case, a metal electrode or a portion of the gate metal electrically contacts at least a portion of the semiconductor surface which was exposed by the etch. Alternatively, they can be ion implanted regions in the semiconductor material, where the implanted regions can extend through the channel region, thereby forming a break in the device channel. Ion implanted regions may be capable of conducting substantial hole, but not substantial electron currents. For example they can be p-type or nominally p-type regions. Isolation regions can be placed in regions of high electric field, or in the vicinity of regions of high electric fields. Since holes may be generated in regions of high electric field, placing an isolation region near the region where the holes are generated can improve hole collection efficiency. Examples of regions that typically have high electric fields during device operation include the regions between the gate and the drain electrode, particularly near the drain-side edge of the gate electrode, or near or beneath a field plate.

Isolation regions can also be placed in regions of low voltage or low electric potential, or in the vicinity of regions of low voltage or low electric potential. Since holes are drawn towards regions of low voltage or low electric potential, placing an isolation region near where the holes are drawn to can improve hole collection efficiency. Examples of regions that are typically at low voltage or low electric potential during device operation include the regions near or beneath the source electrode, the regions near or beneath the gate electrode, or the regions between the source and the gate electrode. Alternatively, isolation regions can be placed in regions of high electric fields (i.e., regions that have high electric fields during device operation). Since holes are generated in regions of high electric fields, placing an isolation region near where the holes are generated can improve hole collection efficiency. Examples of locations that hole collectors can be placed include, but are not limited to, beneath or near the source electrode 14 shown in FIG. 2, beneath or near the gate electrode 16, 18, 25 and 26, between the source electrode 14 and the gate electrode 16, 18, 25 and 26, between the gate electrode 16, 18, 25 and 26 and the drain electrode 15, or beneath or near to a field plate. $W_{tot}$ can be between about 1% and 99% of $W_{source}$, such as between about 10% and 20% of $W_{source}$, where again $W_{tot}$ is the total combined width of all the isolation regions, as depicted in FIG. 2. When the isolation regions 20, 21 and 22 are etched regions, the electric fields along the edges of the etched isolation regions may be increased or enhanced during device operation. Hence, in order to prevent a reduction in the transistor breakdown voltage, it may be necessary to include field plates along some or all of the edges of the etched isolation regions. For example, the same or a similar field plate structure to the one used along the drain-side edge of the gate can be used along some or all of the edges of the etched isolation regions.

A III-N high electron mobility transistor (HEMT) with isolation regions that serve to limit the maximum current can have a maximum current level $I_{max}$ per unit source width which is less than 500 mA/mm, such as less than 350, 150, or 50 mA/mm, while the product of the on-resistance $R_{on}$ and the source width is less than about 30 ohm-millimeters, such less than about 15, 5, 3, 2, or 1 ohm-millimeters. The on-resistance is typically larger for devices that are designed to block larger voltages. Hence, a device designed to be capable of blocking 1200V may have an on-resistance that is about 30 ohm-millimeters or less, while a device designed to be capable of blocking 600V may have an on-resistance that is about 15 ohm-millimeters or less. In some implementations, the maximum current level of a transistor which includes an isolation region is less than 50 A, such as less than 25, 10, or 5 A. In other implementations, the on-resistance of a transistor which includes an isolation region is less than 1 ohm, such as less than 0.5, 0.2, or 0.1 ohms. In yet other implementations, the product of the maximum current level and the on-resistance can be less than about 5 Amp-ohms.

A number of implementations have been described. Nevertheless, it will be understood that various modifications may be made without departing from the spirit and scope of the techniques and devices described herein. Accordingly, other implementations are within the scope of the following claims.

What is claimed is:

1. A transistor device, comprising:
   a source, a gate, and a drain;
   a III-N semiconductor material which includes a gate region between the source and the drain;
   a plurality of channel access regions in the III-N semiconductor material that are between the source and the gate and between the drain and the gate, respectively;
   a channel in the III-N semiconductor material; and
   a plurality of isolation regions in the III-N semiconductor material in or near a region which has a high electric field or is at a low electric potential during device operation, the plurality of isolation regions serving to improve the efficiency of hole collection from the III-N semiconductor material; wherein
   the plurality of isolation regions are in the gate region and serve to reduce an effective width of the channel in the gate region without substantially reducing the effective width of the channel in the channel access regions.

2. The transistor device of claim 1, wherein the gate contacts a surface of the isolation regions.

3. The transistor device of claim 1, wherein each of the isolation regions has a width, and a sum of the widths of the isolation regions is between 20% and 80% the width of the source.

4. The transistor device of claim 1, wherein each of the isolation regions has a width, and a sum of the widths of the isolation regions is between 10% and 90% the width of the source.

5. The transistor device of claim 1, wherein the gate is on an N-face of the III-N semiconductor material.

6. A semiconductor device, comprising:
   a III-N semiconductor material;
   a conductive channel in the III-N semiconductor material;
   a first electrode, a second electrode, and a gate, wherein the gate is between the first and second electrodes, and the III-N semiconductor material includes a gate region between the first and second electrodes; and
   an isolation region in or near a region of the III-N semiconductor material which has a high electric field or is at a low electric potential during device operation, the isolation region serving to improve the efficiency of hole collection from the III-N semiconductor material; wherein
   the isolation region is a p-type or nominally p-type region; and
   the gate is electrically isolated from the isolation region.

7. The semiconductor device of claim 6, wherein the device includes a plurality of the isolation regions and a plurality of channel access regions in the III-N semiconductor material, and the isolation regions further serve to reduce an effective width of the conductive channel in the gate region without substantially reducing an effective width of the conductive channel in the channel access regions.

8. The semiconductor device of claim 6, wherein the isolation region lies beneath or near the gate.

9. The semiconductor device of claim 6, wherein the isolation region lies beneath or near the first electrode.

10. The semiconductor device of claim 6, wherein the isolation region lies between the gate and the first electrode.

11. The semiconductor device of claim 6, wherein the gate is on an N-face of the III-N semiconductor material.

* * * * *